(12) United States Patent
Nakano et al.

(10) Patent No.: US 6,270,618 B1
(45) Date of Patent: Aug. 7, 2001

(54) PLASMA PROCESSING APPARATUS

(75) Inventors: Akira Nakano, Miyagi-ken; Sung Chul Kim, Kyongki-Do; Koichi Fukuda, Miyagi-ken; Yasuhiko Kasama, Miyagi-ken; Tadahiro Ohmi, Miyagi-ken; Shoichi Ono, Miyagi-ken, all of (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 09/205,800

(22) Filed: Dec. 4, 1998

(30) Foreign Application Priority Data

Dec. 17, 1997 (JP) .................................................... 9-364442

(51) Int. Cl.$^7$ .............................. C23F 1/02; C23C 14/02; C23C 16/02
(52) U.S. Cl. ............... 156/345; 204/298.06; 204/298.08; 204/298.34; 204/298.38; 118/723 E; 118/723 MH; 315/111.21
(58) Field of Search ......................... 204/298.06, 298.08, 204/298.34, 298.38; 118/723 E, 723 MW; 156/345; 315/111.21

(56) References Cited

U.S. PATENT DOCUMENTS

| | | | |
|---|---|---|---|
| Re. 34,106 | * 10/1992 | Ohmi | 204/298.08 |
| 4,464,223 | * 8/1984 | Gorin | 315/111.21 |
| 5,248,371 | * 9/1993 | Maher et al. | 156/345 |
| 5,433,813 | 7/1995 | Kuwabara | 156/345 |

* cited by examiner

Primary Examiner—Mark F. Huff
Assistant Examiner—Daborah Chacko-Davis
(74) Attorney, Agent, or Firm—Brinks Hofer Gilson & Lione

(57) ABSTRACT

A plasma processing apparatus is provided which does not require replacement of a band eliminator according to a frequency used, which is capable of performing chamber cleaning without replacing a resonance circuit, and which is capable of performing plasma cleaning of the inside of the chamber without using a bellows. The plasma processing apparatus includes a resonance circuit (band eliminator) for causing series resonance with a microwave circuit formed of at least a susceptor electrode and a processing chamber in order to trap plasma between a plasma excitation electrode and the susceptor electrode when the surface of a workpiece placed on the susceptor electrode is processed by plasma generated between the plasma excitation electrode and the susceptor electrode, which are provided inside the processing chamber; and for causing parallel resonance with the microwave circuit in order to diffuse plasma inside the processing chamber when performing plasma cleaning.

10 Claims, 12 Drawing Sheets

PLASMA PROCESSING APPARATUS

BACKGROUND OF THE INVENTION

1. Field of the Invention

The present invention relates to a plasma processing apparatus.

2. Description of the Related Art

Hitherto, as a plasma processing apparatus, a plasma processing apparatus, as shown in FIG. 11, has been known.

A conventional plasma processing apparatus has a matching circuit interposed between a high-frequency power source 1 and a plasma excitation electrode 4. The matching circuit is a circuit for obtaining impedance matching between the high-frequency power source 1 and the plasma excitation electrode 4.

The high-frequency power from the high-frequency power source 1 is supplied by a power-supply plate 3 to the plasma excitation electrode 4 through the matching circuit.

The matching circuit is housed in a matching box and the power supply plate 3 is housed in a house 21.

A shower plate 5 having a number of holes 7 formed therein is provided below the plasma excitation electrode (cathode electrode) 4, and a space 6 is formed by the plasma excitation electrode 4 and the shower plate 5. A gas introduction pipe 17 is provided in this space 6. Gas introduced from the gas introduction pipe 17 is supplied through the holes 7 of the shower plate 5 into a chamber 60 formed by a chamber wall 10. Reference numeral 9 denotes an insulator which insulates the chamber wall 10 from the plasma excitation electrode (cathode electrode) 4. Illustration of an exhaust system has been omitted.

Meanwhile, inside the chamber 60, a wafer susceptor (susceptor electrode) 8, on which a substrate 16 is placed, which acts also as a plasma excitation electrode is provided, with a susceptor shield 12 being provided around the susceptor electrode 8. The wafer susceptor 8 and the susceptor shield 12 are movable up and down by a bellows 11 so that the distance between the plasma excitation electrode 4 and the wafer susceptor 8 can be adjusted.

A second high-frequency power source 15 is connected to the wafer susceptor 8 through the matching circuit housed inside a matching box 14 and a shaft 13. The chamber and the susceptor shield 12 are at the same electrical potential in terms of direct current. In FIG. 11, reference numerals 61a and 61b each denote a resonance circuit, which acts as a band eliminator or a filter.

A case is considered in which, for example, high-frequency power of $f_1$=13.56 MHz is supplied to the plasma excitation electrode 4 and high-frequency power of $f_2$=100 MHz is supplied to the susceptor electrode 8.

The band eliminator 61b used for the susceptor electrode 8 is a series circuit of LC as shown in FIG. 11, and if $$2\pi f_1 = 1/(L_2 C_2)^{1/2}$$

is set, a series resonance state is reached at a resonance frequency of $f_1$, the impedance becomes a local minimum, and only a high-frequency wave of $f_1$ can be selected and supplied to the susceptor electrode 8, making it possible to generate plasma in a state in which it is trapped between the plasma excitation electrode 4 and the susceptor electrode 8. With respect to $f_1$=13.56 MHz, the susceptor electrode 8 is nearly completely short-circuited to a ground.

FIG. 12 shows another conventional plasma processing apparatus.

In the plasma processing apparatus shown in FIG. 12, a shower plate 5 is not used, and the cathode electrode 4, which is a plasma excitation electrode, and the susceptor electrode 8 directly oppose each other. A shield 20 is provided around the rear surface of the cathode electrode 4. The remaining construction is the same as that of the plasma processing apparatus shown in FIG. 1.

In the conventional plasma processing apparatus, the impedance of a band eliminator is designed so as to generate plasma in a state in which it is trapped efficiently between the plasma excitation electrode 4 and the susceptor electrode 8. That is, the impedance is designed in such a manner as to be fixed so as to efficiently perform film formation.

In this regard, unlike during film formation, when cleaning of the chamber is performed, it is preferable that plasma be generated in such a manner as to be diffused over the entire chamber. In that case, the impedance with respect to the frequency $f_1$ is preferably made a local maximum point. That is, it is preferable that a parallel resonance state be reached.

There is another case in which, as the value of $f_1$, a frequency other than 13.56 MHz described above is used.

However, in the conventional plasma processing apparatus, since the impedance of a band eliminator is designed in such a manner as to be fixed in accordance with the frequency used, when cleaning of the chamber is desired to be performed or when another frequency is desired to be used, this must be performed after the band eliminator is replaced with another one.

SUMMARY OF THE INVENTION

An object of the present invention is to provide a plasma processing apparatus which solves the problems of the conventional technology and which does not require the replacement of a band eliminator according to a frequency to be used. Another object of the present invention is to provide a plasma processing apparatus which is capable of performing chamber cleaning without replacing a band eliminator.

To achieve the above-mentioned objects, the present invention provides a plasma processing apparatus, comprising: a resonance circuit for causing series resonance with a microwave circuit formed of at least a susceptor electrode and a processing chamber in order to trap plasma between a plasma excitation electrode and the susceptor electrode when the surface of a workpiece placed on the susceptor electrode is processed by plasma generated between the plasma excitation electrode and the susceptor electrode, which are provided inside the processing chamber; and for causing parallel resonance with the microwave circuit in order to diffuse plasma inside the processing chamber when performing plasma cleaning.

The above and further objects, aspects and novel features of the invention will become more apparent from the following detailed description when read in connection with the accompanying drawings.

DESCRIPTION OF THE PREFERRED EMBODIMENTS

[First Embodiment]

Figure 1A:
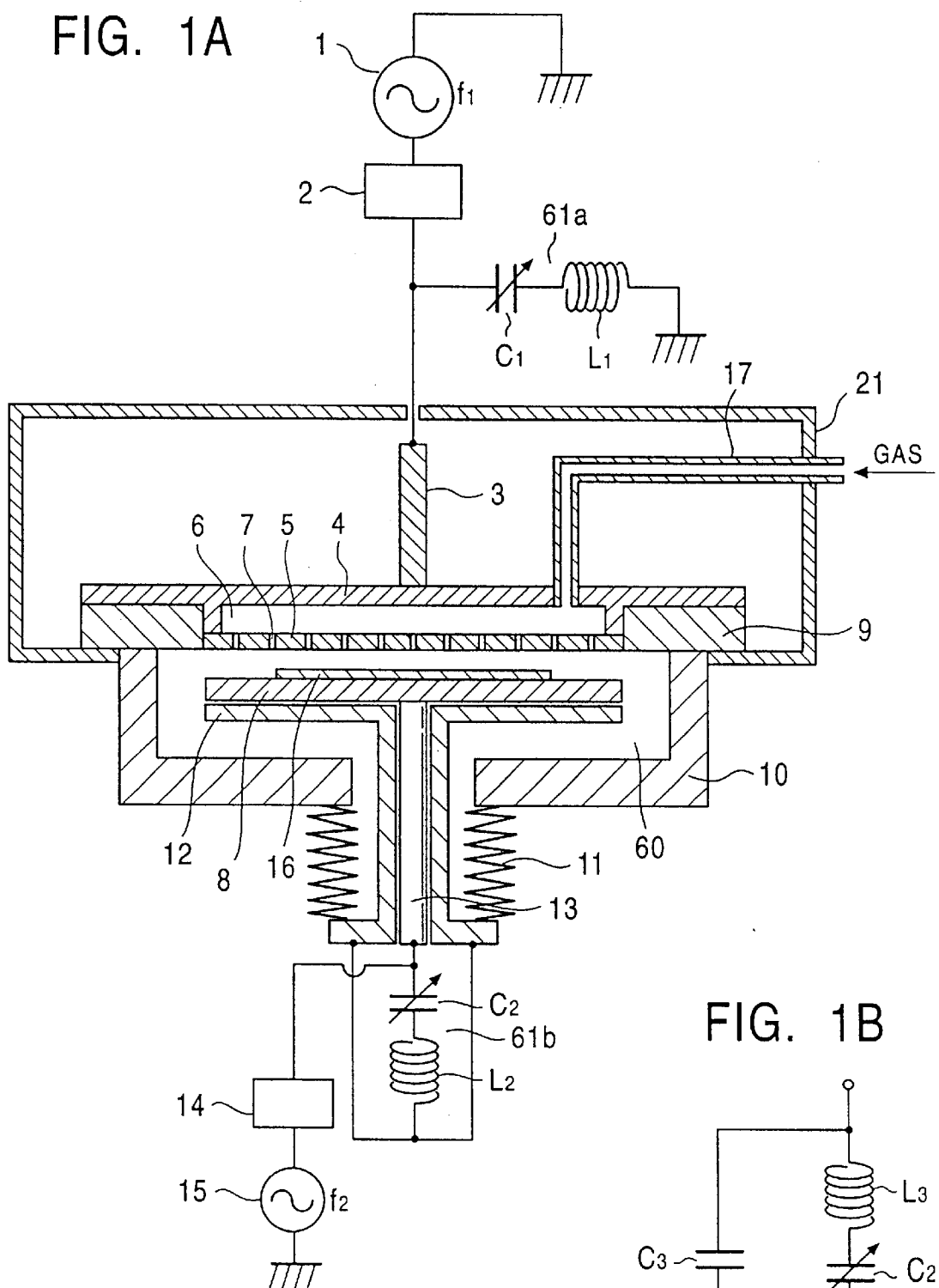
FIG. 1A is a sectional view of a plasma processing apparatus according to a first embodiment of the present invention.

FIG. 1 shows a plasma processing apparatus according to a first embodiment of the present invention.

The plasma processing apparatus of the present invention comprises a resonance circuit (band eliminator) 61b for causing series resonance with a microwave circuit formed of at least a susceptor electrode 8 and a processing chamber 60 in order to trap plasma between a plasma excitation electrode 4 and the susceptor electrode 8 when the surface of a workplace 16 placed on the susceptor electrode 8 is processed by plasma generated between the plasma excitation electrode 4 and the susceptor electrode 8, which are provided inside the processing chamber 60; and for causing parallel resonance with the microwave circuit in order to diffuse plasma inside the processing chamber 60 when performing plasma cleaning.

In this example, a variable capacitor $C_1$ is also used in a band eliminator 61a on the side of the plasma excitation electrode 4 in order to make it possible to adjust the impedance. However, since the band eliminator 61a is a circuit mainly for the purpose of preventing the high-frequency power of frequency $f_2$ from being loaded into the plasma excitation electrode 4, the band eliminator 61a itself need not always be provided depending on the application, and the impedance of the band eliminator 61a need not always be variable.

Figure 1B:
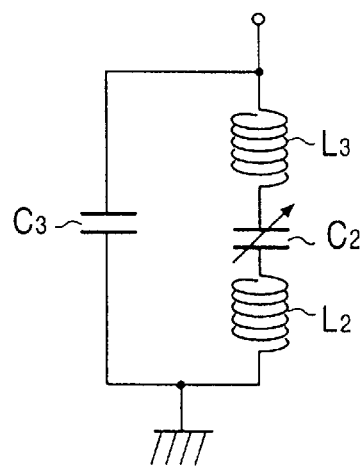
FIG. 1B is a circuit diagram thereof.

Furthermore, in this example, the connection of the band eliminator 61b to the susceptor shield 12 is performed at a plurality of points at symmetrical positions. As shown in FIG. 1A the susceptor shield 12 is connected to the processing chamber 10 through the bellows 11.

Figure 2:
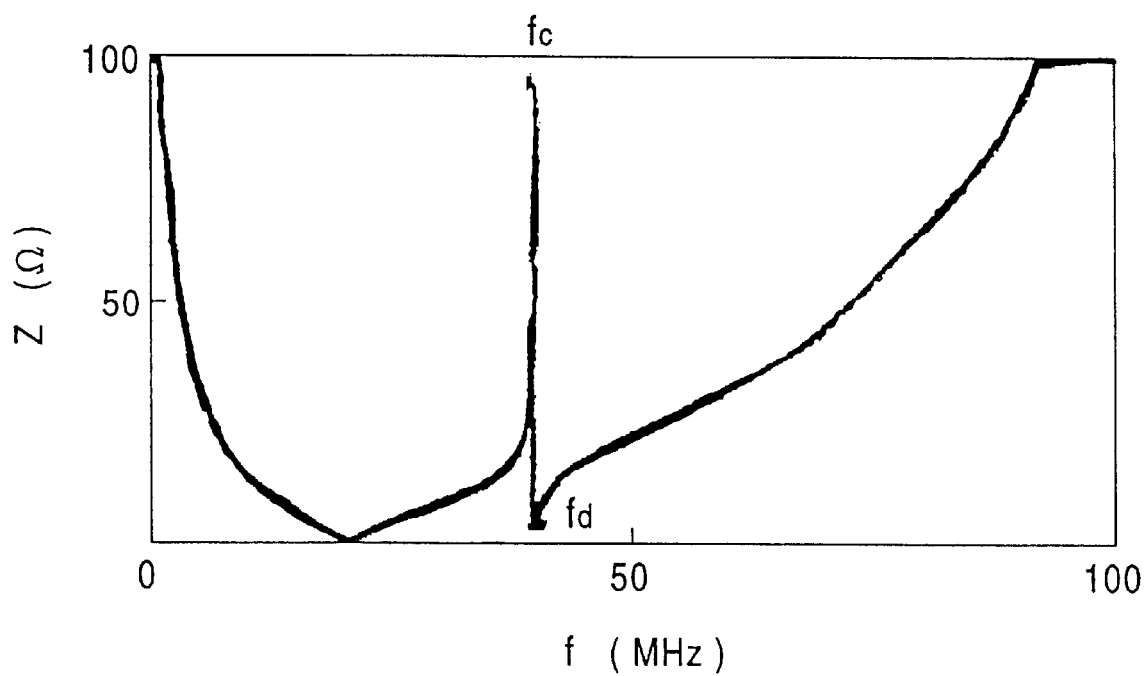
FIG. 2 is a graph showing the relationship between the frequency and the impedance of the plasma processing apparatus of FIG. 1.

The band eliminator shown in FIG. 1, as shown in FIG. 2, is designed so that the impedance of the plasma processing apparatus assumes a local minimum value when the frequency is $f_d$=40 MHz in a case where the variable capacitor is in a range of 50 to 200 pF.

When high-frequency power of a frequency $f_d$=40 MHz was supplied from the high-frequency power source 15 to the susceptor electrode 8 and film formation was performed, the plasma was trapped between the plasma excitation electrode 4 and the susceptor electrode 8.

After the film formation was completed, cleaning of the chamber was performed with the value of $C_2$ being varied by the variable capacitor so that resonance (parallel resonance) occurs at a frequency of $f_c$ at which the impedance reaches a local maximum value.

That is, a parasitic capacitance $C_3$ is present between the susceptor electrode 8 and the chamber wall 10, and since $L_3$ which is parasitic to a shaft 13 are present in the shaft 13, the chamber has $C_3$ and $L_3$ which is parasitic thereto. These constitute a microwave circuit formed of the susceptor electrode and the processing chamber, and the overall circuit is a circuit shown in FIG. 1B. By varying $C_2$ in this circuit, parallel resonance occurred. As a result, plasma was diffused over the entire chamber.

[Second Embodiment]

Figure 3:
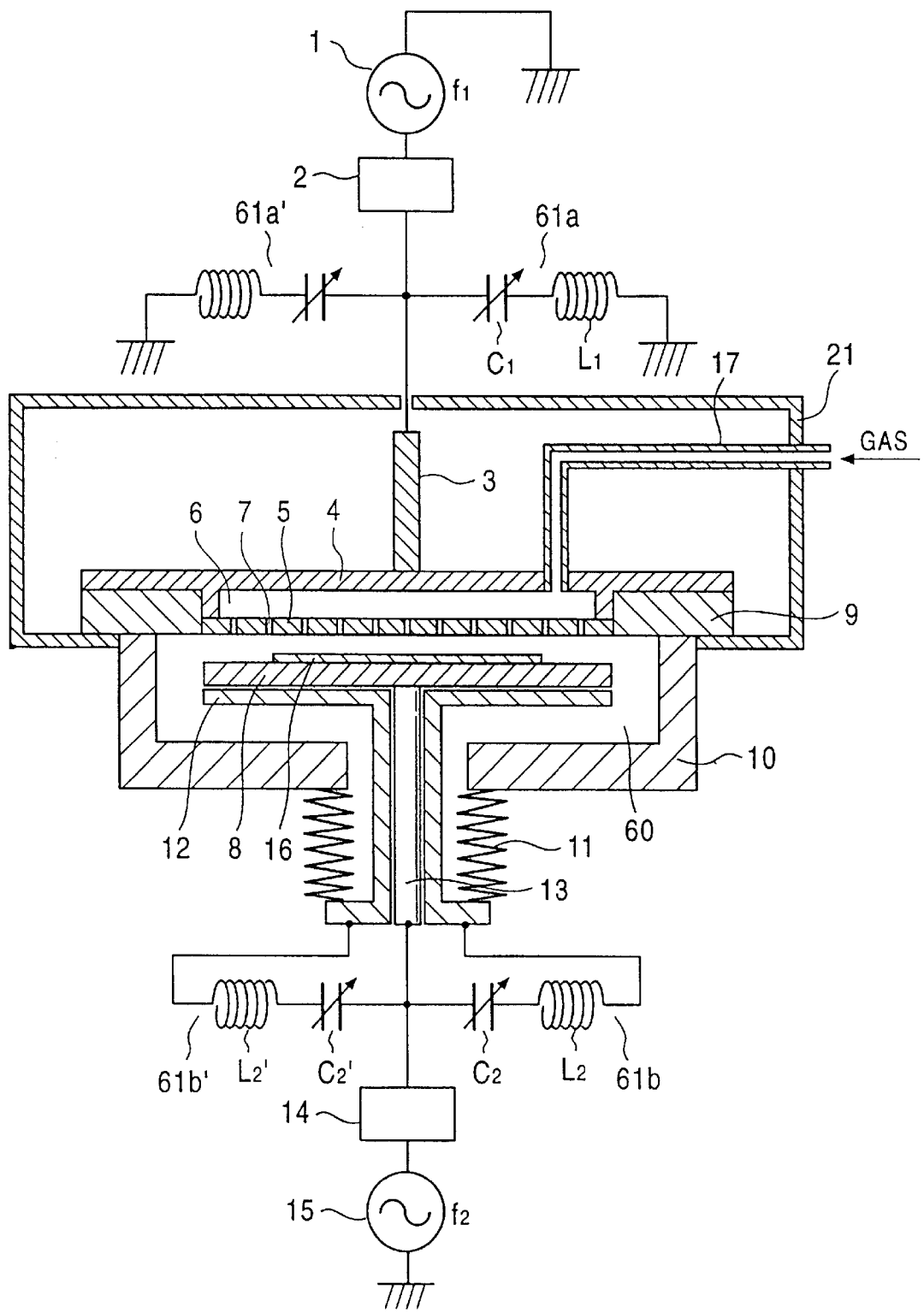
FIG. 3 is a sectional view of a plasma processing apparatus according to a second embodiment of the present invention.

FIG. 3 shows a plasma processing apparatus according to a second embodiment of the present invention.

In this example, for the band eliminator, two, 61a and 61a', are provided symmetrically, and two, 61b and 61b', are provided symmetrically.

In this example, since a plurality of band eliminators 61a and 61a', and 61b and 61b' are provided, and the band eliminators 61a and 61a', and 61b and 61b' are provided symmetrical to each other, it is possible to supply high-frequency power to the susceptor electrode 8 uniformly. The remaining construction is the same as in the first embodiment.

[Third Embodiment]

Figure 4:
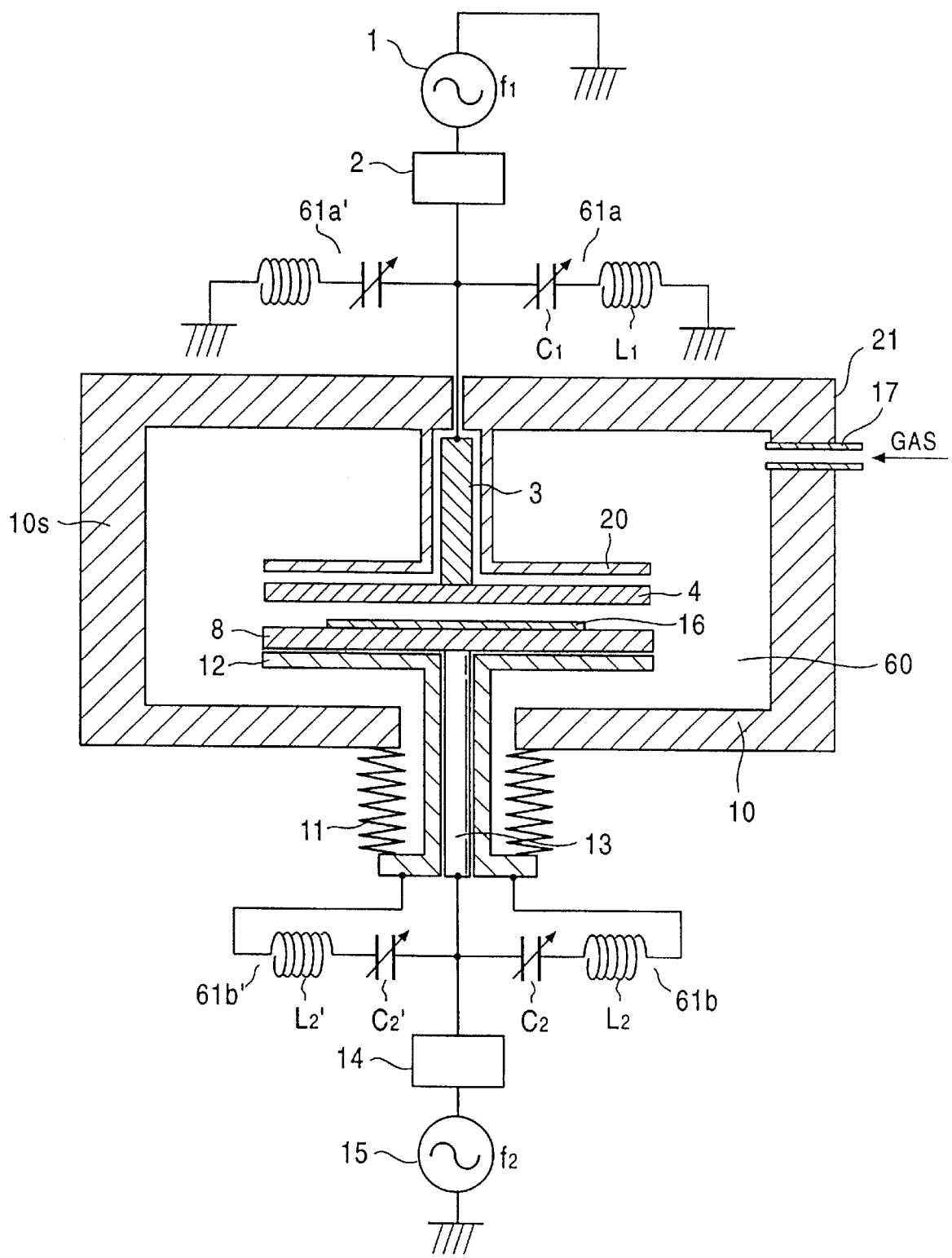
FIG. 4 is a sectional view of a plasma processing apparatus according to a third embodiment of the present invention.

FIG. 4 shows a plasma processing apparatus according to a third embodiment of the present invention.

Figure 12:
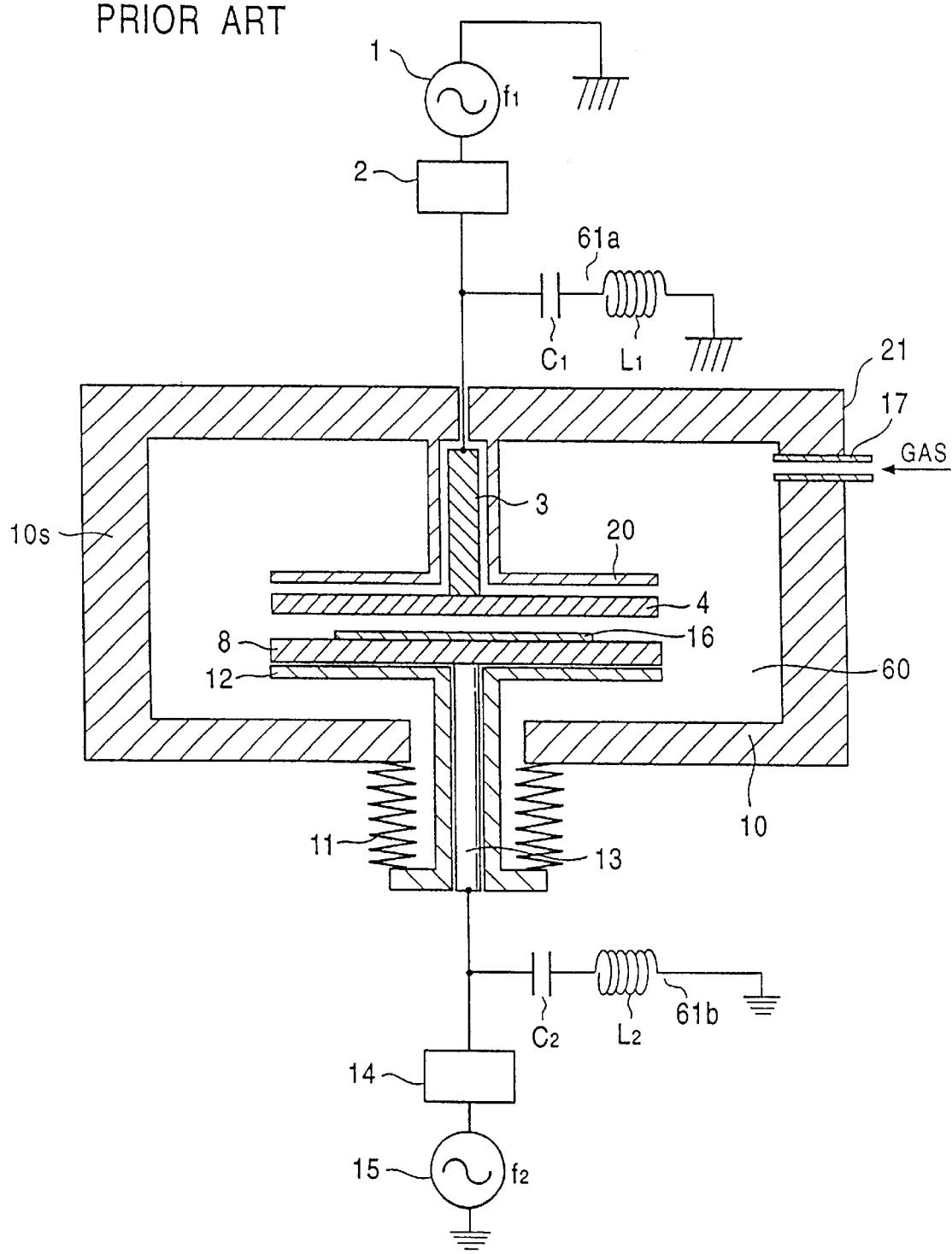
FIG. 12 is a sectional view of a plasma processing apparatus according to a conventional example.

This example is such that, in a conventional example shown in FIG. 12, the band eliminators 61a and 61a', and 61b and 61b' shown in the second embodiment are provided. The remaining construction is the same as in the first embodiment.

[Fourth Embodiment]

Figure 5:
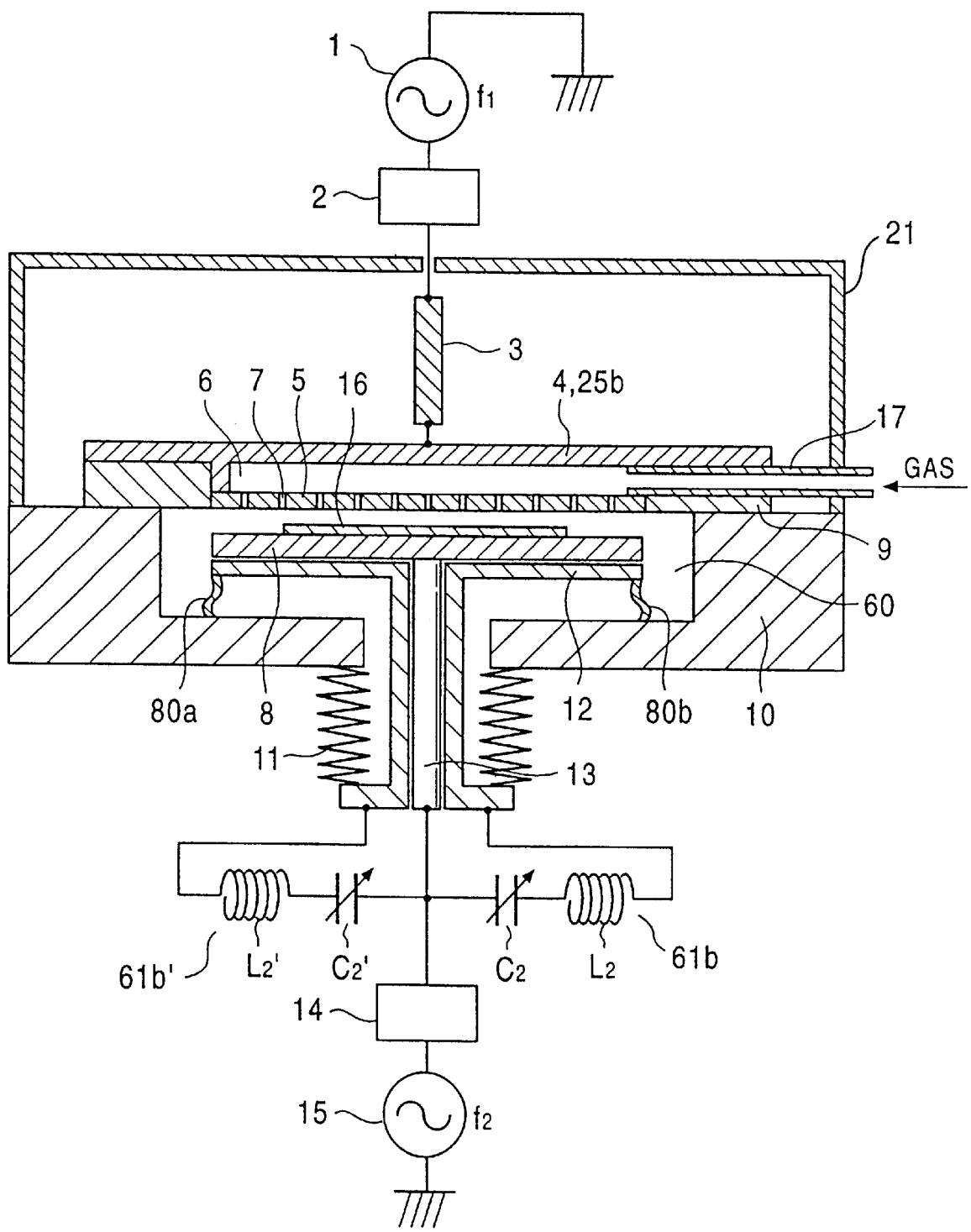
FIG. 5 is a sectional view of a plasma processing apparatus according to a fourth embodiment of the present invention.
Figure 6:
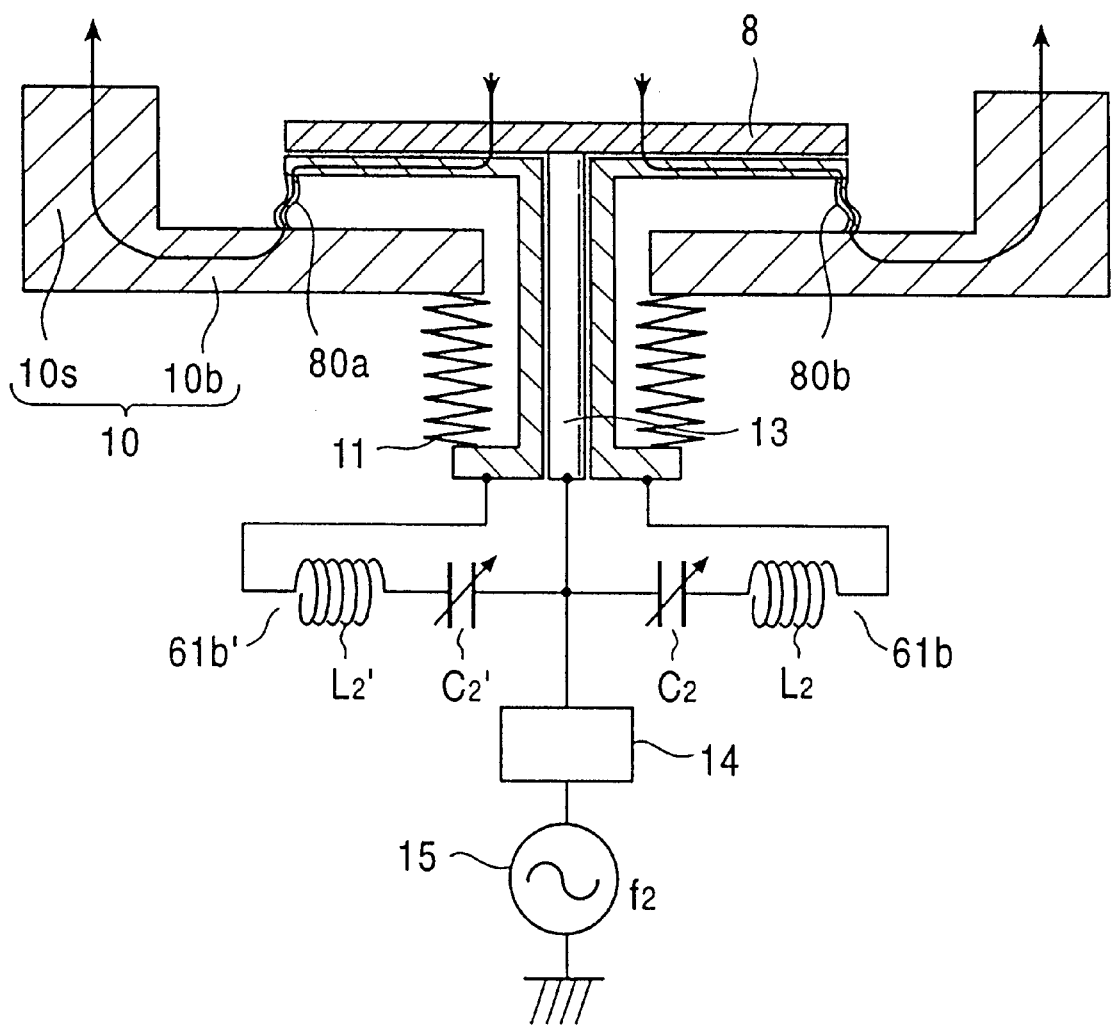
FIG. 6 is an enlarged view taken from the vicinity of a susceptor electrode of FIG. 5.

FIG. 5 shows a plasma processing apparatus according to a fourth embodiment of the present invention. FIG. 6 is an enlarged view taken from the vicinity of the susceptor electrode 8 of FIG. 5.

In the plasma processing apparatus of this example, in addition to the apparatus shown in the first embodiment, the section between the chamber wall 10 and the electrode shield 12 which is at the same electrical potential with the chamber in terms of direct current is short-circuited by metal plates 80a and 80b.

In the plasma processing apparatus of this example, high-frequency power is supplied from the high-frequency power source 1 to a coaxial cable, the matching circuit, the power-supply plate 3, and the plasma excitation electrode (cathode electrode) 4. In this regard, it is the same as the conventional plasma processing apparatus. Meanwhile, when the passage of the high-frequency current is considered, the current passes through the plasma space (chamber 60) via the above, after which the high-frequency current passes through another electrode (susceptor electrode) 8, a horizontal section of the shield 12, the metal plates 80a and 80b, a bottom 10b of the chamber wall 10, and a side wall 10s of the chamber wall 10. Thereafter, the current passes through the housing of the matching box 2 and returns to the ground of the high-frequency power source 1.

In the conventional plasma processing apparatus, the high-frequency current passes through a vertical section of the shield 12. If the size of a substrate 16 is increased, the distance between the shield 12 and the chamber side wall inevitably increases. Mutual inductance which occurs by the high-frequency current flowing through the shield 12 and that flowing through the chamber side wall 10s increases with an increase in the distance between them, and the power consumption efficiency is decreased. Therefore, in the conventional plasma processing apparatus, power consumption efficiency is inevitably decreased with respect to a substrate of a large size.

In the plasma processing apparatus of this example, however, since high-frequency current passes through the metal plates 80a and 80b nearer to the chamber side wall 10s than the vertical section of the shield 12, it is possible to greatly reduce an occurrence of mutual inductance and to greatly increase the power consumption efficiency.

Figure 11:
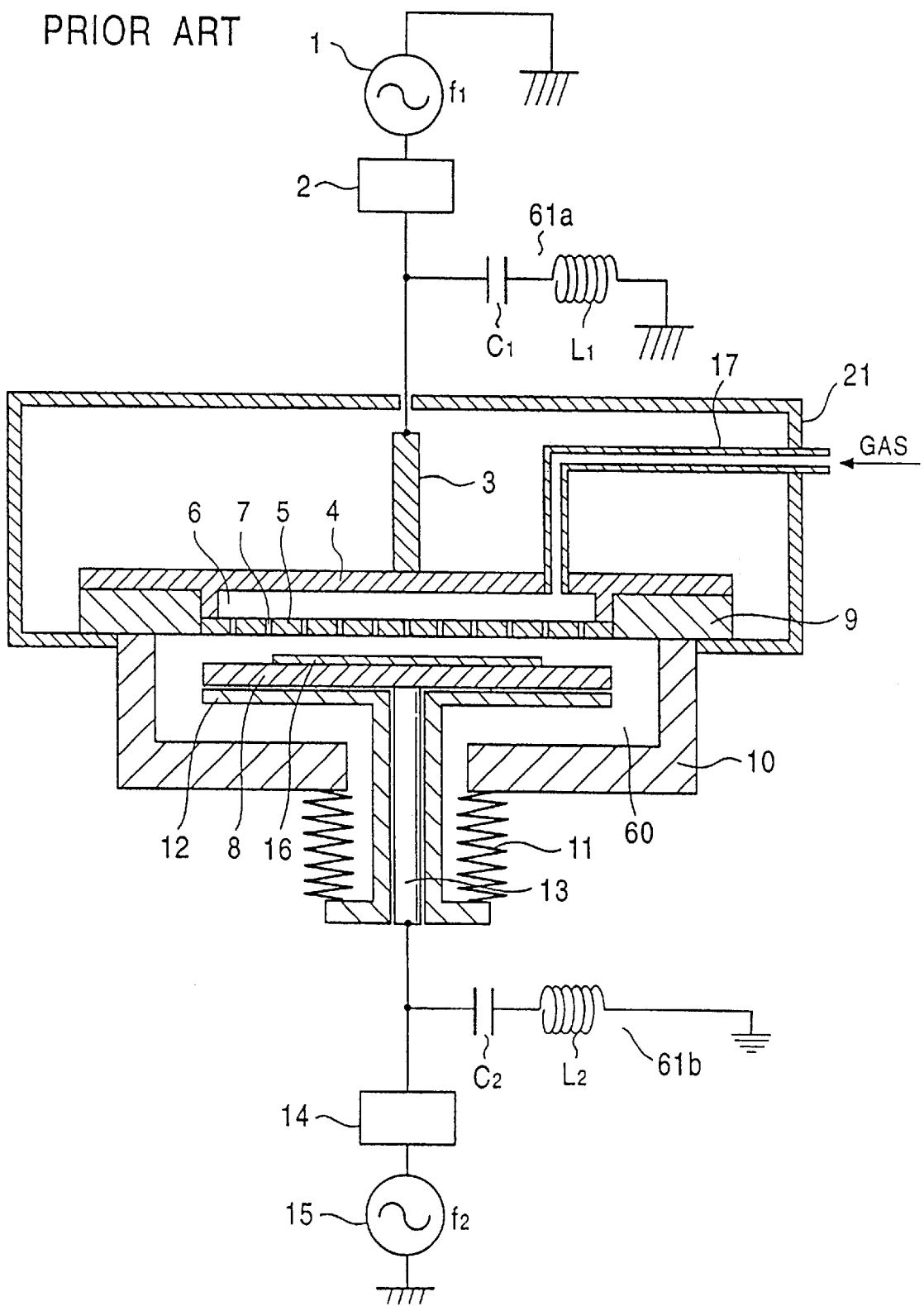
FIG. 11 is a sectional view of a plasma processing apparatus according to a conventional example.

In the apparatus shown in FIG. 5, the power consumption efficiency can be increased to about two times as great as that of the apparatus shown in FIG. 11. Also, in the apparatus shown in FIG. 5, the frequency dependence of the susceptor impedance is small.

Figure 7:
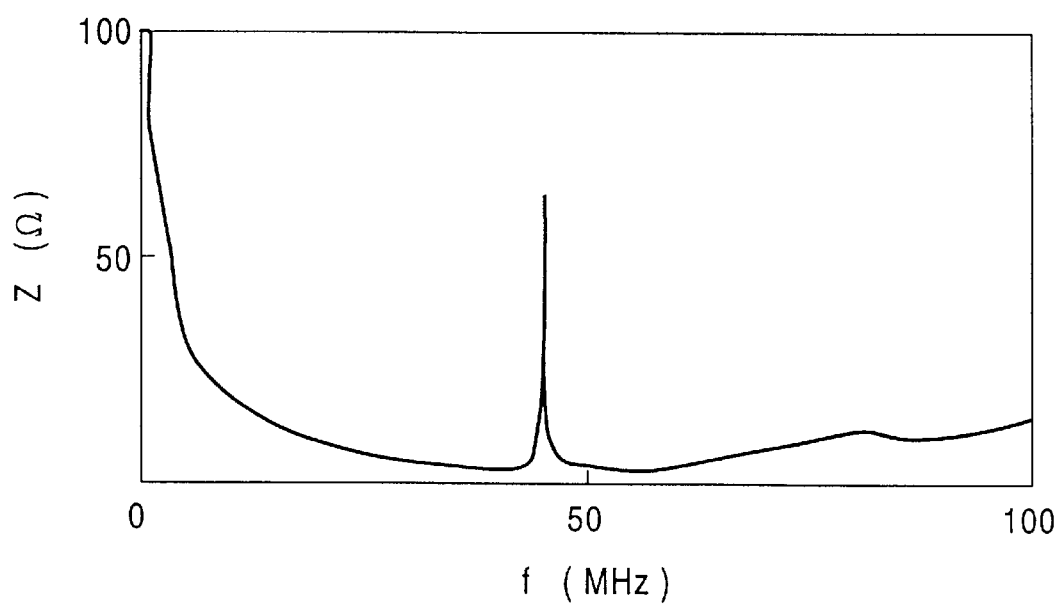
FIG. 7 is a graph showing the relationship between the frequency and the impedance of the plasma processing apparatus of FIG. 5.

The susceptor impedance of the apparatus shown in FIG. is shown in FIG. 7.

As can be seen in FIG. 7, in the plasma processing apparatus of this example, the susceptor impedance is much smaller than that of the plasma processing apparatus of the conventional example, and the frequency dependence is small. As can be seen from a comparison with FIG. 2, the frequency range indicating a local minimum value is wide.

[Fifth Embodiment]

Figure 8:
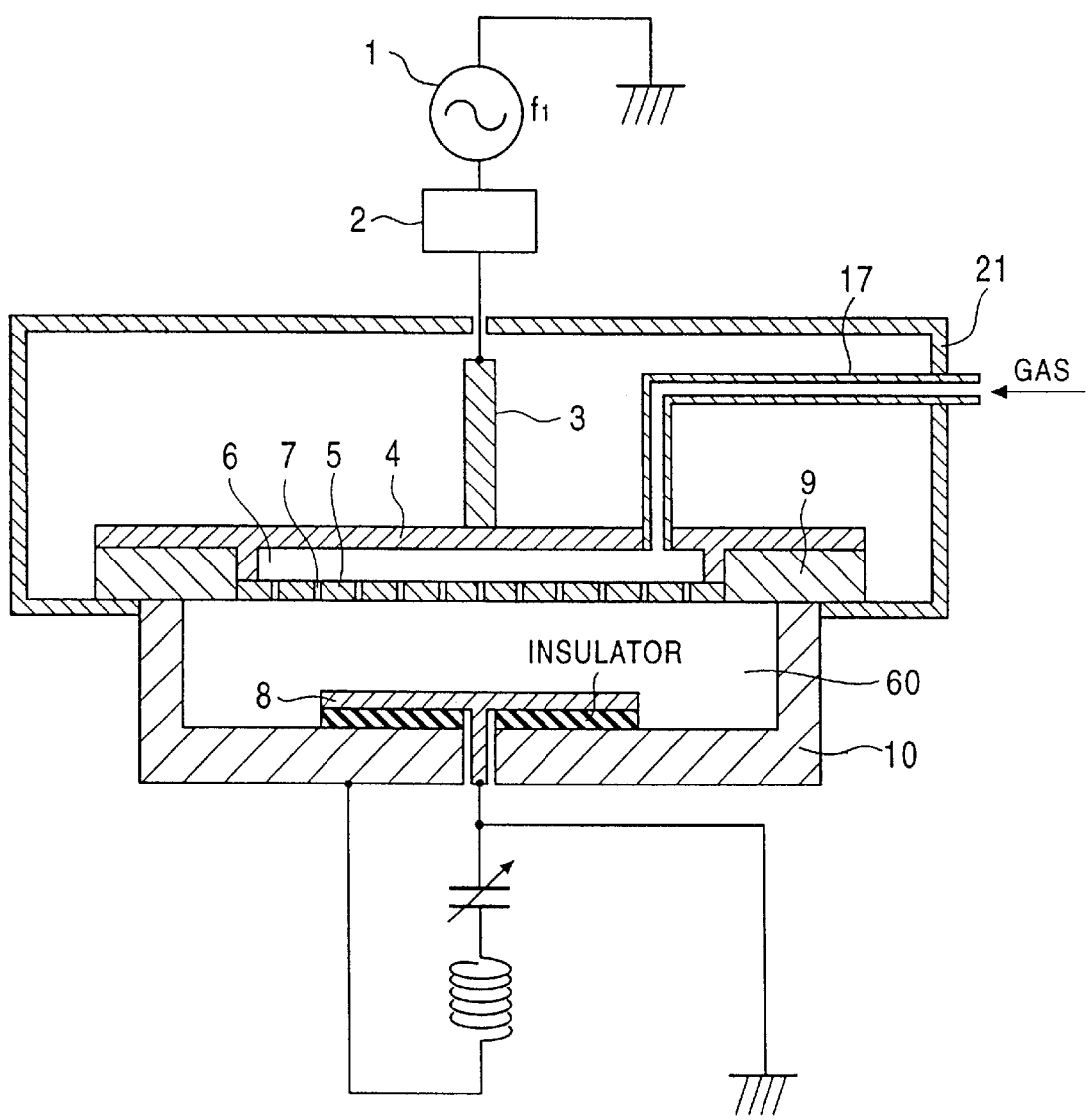
FIG. 8 is a sectional view of a plasma processing apparatus according to a fifth embodiment of the present invention.

FIG. 8 shows a plasma processing apparatus according to a fifth embodiment of the present invention. Although in the first to fourth embodiments what is commonly called a two-frequency excitation-type plasma processing apparatus that supplies high-frequency power to the plasma excitation electrode 4 and the susceptor electrode 8 is described, this example is a one-frequency excitation-type plasma processing apparatus that supplies high-frequency power to only the plasma excitation electrode 4.

In this example, a bellows is not provided, and the band eliminator is connected to one point. The remaining construction is the same as in the first to fourth embodiments.

Also in this example, since a variable capacitor is provided in the band eliminator, it is possible to diffuse plasma over the entire chamber (processing chamber) if a parallel resonance point is selected by the variable capacitor without moving the susceptor electrode 8. Therefore, even if a bellows is not provided, cleaning of the chamber is possible.

Although in the first to fourth embodiments a bellows is provided, cleaning of the chamber is possible without using the bellows.

[Sixth Embodiment]

Figure 9:
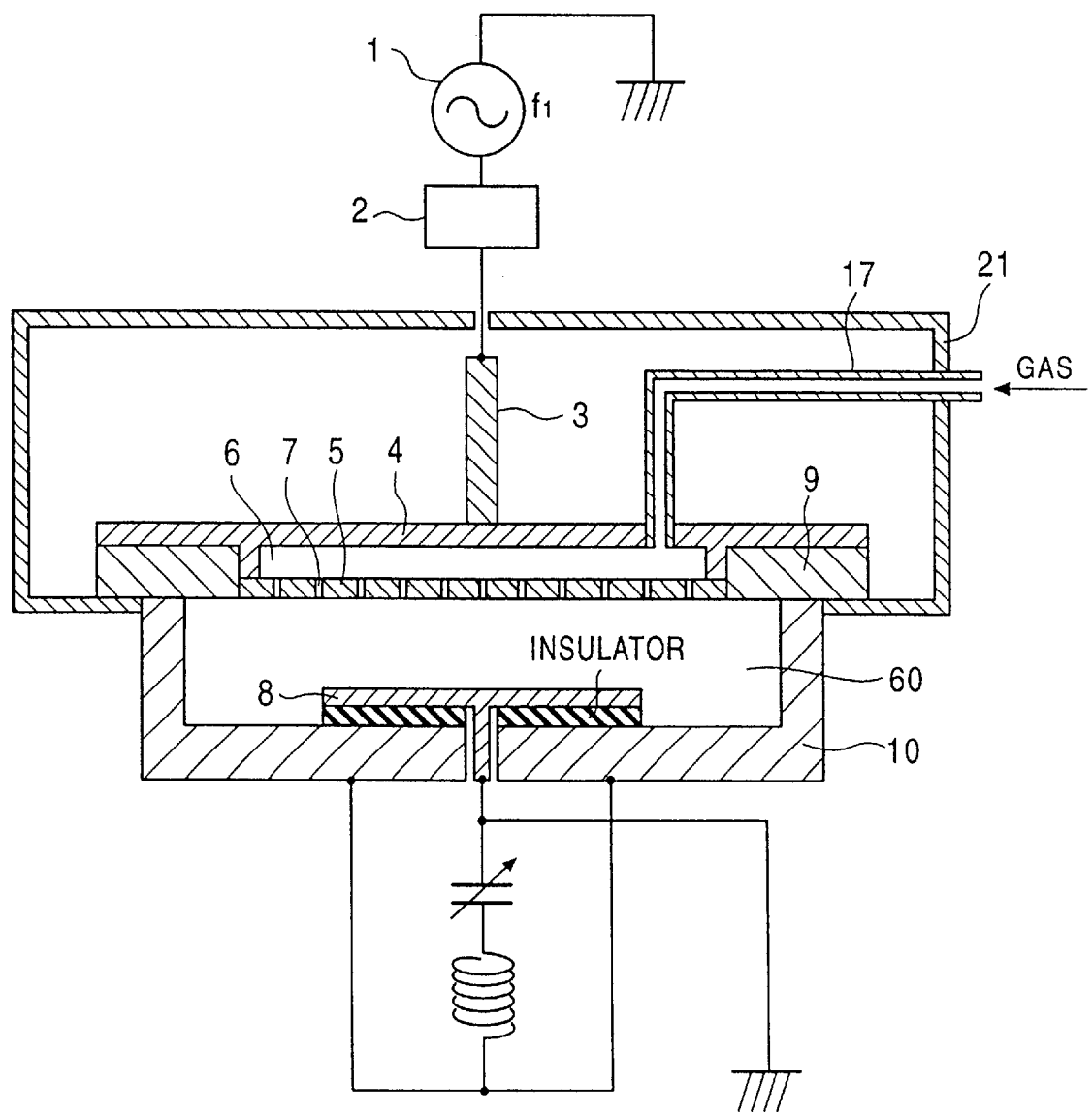
FIG. 9 is a sectional view of a plasma processing apparatus according to a sixth embodiment of the present invention.

FIG. 9 shows a plasma processing apparatus according to a sixth embodiment of the present invention.

This example differs from the fifth embodiment in that the band eliminator is connected to two points in a symmetrical manner. The remaining construction is the same as in the fifth embodiment.

In this example, plasma which was more uniform than in the fifth embodiment could be generated inside the chamber during chamber cleaning, and uniform cleaning was possible.

[Seventh Embodiment]

Figure 10:
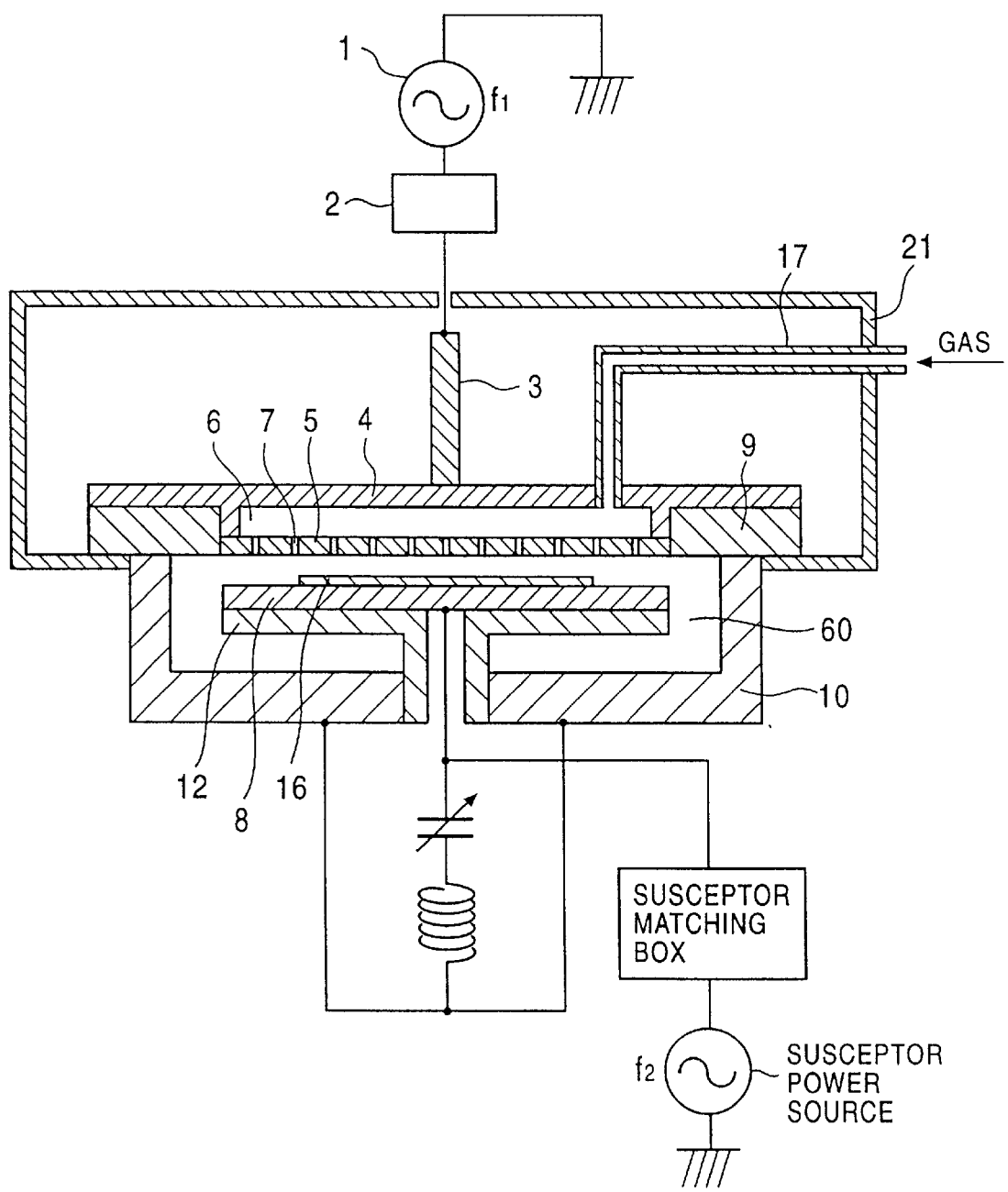
FIG. 10 is a sectional view of a plasma processing apparatus according to a seventh embodiment of the present invention.

FIG. 10 shows a plasma processing apparatus according to a seventh embodiment of the present invention.

This example is also what is commonly called a two-frequency excitation-type plasma processing apparatus. This example differs from the first embodiment in that a bellows is not provided and the susceptor shield 12 is brought into contact with the chamber wall 10. The remaining construction is the same as in the first embodiment.

Although the foregoing embodiments describe a case in which a capacitor is variable, it is a matter of course that a coil may be variable, and series resonance and parallel resonance may occur.

According to the present invention, a plasma processing apparatus that does not require replacement of a band eliminator according to the frequency used is provided. Also, a plasma processing apparatus that is capable of performing chamber cleaning without replacing a band eliminator is provided. Furthermore, plasma cleaning of the inside of the chamber is possible without using a bellows.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A plasma processing apparatus, comprising:
   a plasma excitation electrode provided inside a processing chamber;
   a susceptor electrode provided inside the processing chamber; and
   a resonance circuit comprising a variable capacitor and a coil which are connected in series between end portions, said end portions of said resonance circuit being connected to said susceptor electrode and said processing chamber, respectively, wherein said resonance circuit is configured to cause series resonance with a first circuit formed of at least said susceptor electrode and said processing chamber by adjusting said variable capacitor to trap plasma between said plasma excitation electrode and said susceptor electrode when a surface of a workpiece placed on said susceptor electrode is processed by plasma generated between said plasma excitation electrode and said susceptor electrode and causes parallel resonance with said first circuit by adjusting said variable capacitor in order to diffuse plasma inside said processing chamber when performing plasma cleaning.

2. A plasma processing apparatus according to claim 1, wherein a susceptor shield is disposed around said susceptor electrode and a supporting shaft of said susceptor electrode, said susceptor shield is mounted to said processing chamber in a manner to be movable through a bellows disposed around a cylindrical section of said supporting shaft and said susceptor shield, and wherein said bellows expands or shrinks so that said susceptor electrode, said supporting shaft, and said susceptor shield can move from said plasma excitation electrode and said resonance circuit is connected between the supporting shaft and said susceptor shield.

3. A plasma processing apparatus according to claim 2, wherein said resonance circuit is connected to at least two points of said susceptor shield, and these points are at positions symmetrical about an axis of said supporting shaft.

4. A plasma processing apparatus according to claim 2, wherein said susceptor shield is connected to an inner wall of said processing chamber through a metal plate and is capable of functioning as an alternating current short-circuit.

5. A plasma processing apparatus according to claim 1, wherein said susceptor electrode is disposed on an inner bottom surface of said processing chamber through an insulator, and said resonance circuit is connected between a supporting shaft of said susceptor electrode and said processing chamber.

6. A plasma processing apparatus, comprising:

a plasma excitation electrode provided inside a processing chamber;

a susceptor electrode provided inside the processing chamber; and a pair of resonance circuits each comprising a variable capacitor and a coil which are connected in series between end portions connected to said susceptor electrode and said processing chamber, respectively, said resonance circuits being connected to said susceptor electrode and said processing chamber at symmetrical positions, wherein said resonance circuits are configured to cause series resonance with a first circuit formed of at least said susceptor electrode and said processing chamber wherein said series resonance are attained by adjusting said variable capacitor to trap plasma between said plasma excitation electrode and said susceptor electrode when the surface of a workpiece placed on said susceptor electrode is processed by plasma generated between said plasma excitation electrode and said susceptor electrode and causes parallel resonance with said first circuit by adjusting said variable capacitor to diffuse plasma inside said processing chamber when performing plasma cleaning.

7. A plasma processing apparatus according to claim 6, wherein a susceptor shield is disposed around said susceptor electrode and a supporting shaft of said susceptor electrode, said susceptor shield is mounted to said processing chamber in such a manner as to be movable through a bellows disposed around a cylindrical section of said supporting shaft and said susceptor shield, and wherein said bellows expands or shrinks so that said supporting shaft and said susceptor shield can move from said plasma excitation electrode, and said pair of resonance circuits are connected between said supporting shaft and said susceptor shield at symmetrical positions about an axis of said supporting shaft.

8. A plasma processing apparatus according to claim 7, wherein the connection of each of said pair of resonance circuits to said susceptor shield are at positions symmetrical about said axis of said supporting shaft.

9. A plasma processing apparatus according to claim 7, wherein said susceptor shield is connected to an inner wall of said processing chamber through a metal plate and is capable of functioning as an alternating current short-circuit.

10. A plasma processing apparatus according to claim 6, wherein said susceptor electrode is disposed on an inner bottom surface of said processing chamber through an insulator and said pair of resonance circuits are connected between a supporting shaft of said susceptor electrode and said processing chamber at symmetrical positions about an axis of said supporting shaft.

* * * * *